US007764212B2

(12) United States Patent
Lee et al.

(10) Patent No.: US 7,764,212 B2
(45) Date of Patent: Jul. 27, 2010

(54) DRIVING APPARATUS FOR DISPLAY

(75) Inventors: Hyung-Min Lee, Daegu (KR); Gyu Hyeong Cho, Daejeon (KR); Young-Suk Son, Daejeon (KR); Yong-Joon Jeon, Daejeon (KR); Jin Yong Jeon, Daegu (KR); Seung-Chul Jung, Gwangju (KR)

(73) Assignee: Korea Advanced Institute of Science and Technology (KR)

( * ) Notice: Subject to any disclaimer, the term of this patent is extended or adjusted under 35 U.S.C. 154(b) by 160 days.

(21) Appl. No.: 11/930,850

(22) Filed: Oct. 31, 2007

(65) Prior Publication Data

US 2009/0051575 A1 Feb. 26, 2009

(30) Foreign Application Priority Data

Aug. 22, 2007 (KR) ..................... 10-2007-0084417

(51) Int. Cl.
*H03M 1/66* (2006.01)

(52) U.S. Cl. ........................ 341/145; 341/144; 341/154

(58) Field of Classification Search ................ 341/145, 341/154

See application file for complete search history.

(56) References Cited

U.S. PATENT DOCUMENTS 4,543,560 A * 9/1985 Holloway .................. 341/133
4,584,568 A 4/1986 Zomorrodi
5,877,717 A 3/1999 Tu et al.
5,914,682 A * 6/1999 Noguchi ..................... 341/145
6,268,817 B1 * 7/2001 Min et al. ................... 341/145
6,950,045 B2 9/2005 Kim
7,161,517 B1 * 1/2007 Yen et al. .................... 341/145
7,180,497 B2 * 2/2007 Lee et al. ...................... 345/98

FOREIGN PATENT DOCUMENTS

EP 0600498 8/1994

* cited by examiner

*Primary Examiner*—Khai M Nguyen
(74) *Attorney, Agent, or Firm*—The Belles Group, P.C.

(57) ABSTRACT

A driving apparatus for a display is provided. The driving apparatus for a display comprises a reference voltage generator, a digital-to-analog converter, and an output unit. The reference voltage generator generates a plurality of reference voltages, and receives a difference value between two adjacent reference voltages and generates a plurality of sub reference voltages. The digital-to-analog converter selects one of the reference voltages and outputs the selected reference voltage as a first analog signal. The digital-to-analog converter selects one of the sub reference voltages and outputs the selected reference voltage as a second analog signal. The output unit processes, by addition or subtraction, the first and second analog signals for output.

14 Claims, 9 Drawing Sheets

PRIOR ART

PRIOR ART

PRIOR ART

PRIOR ART

PRIOR ART

DRIVING APPARATUS FOR DISPLAY

RELATED APPLICATION

This Nonprovisional application claims priority under 35 U.S.C. §119(a) on Korean Patent Application No. 10-2007-0084417 filed on Aug. 22, 2007 the entire contents of which are hereby incorporated by reference.

BACKGROUND OF THE INVENTION

1. Field of the Invention

The present invention relates to a driving apparatus for a display. More particularly, the present invention relates to a driving apparatus for a display with an area reduced.

2. Description of the Related Art

Examples of general Flat Panel Displays (FPDs) are Active-Matrix Liquid Crystal Displays (AMLCDs) and Active-Matrix Organic Light Emitting Eiodes (AMOLEDs). In order for the FPDs to express a gray scale of 10 bits or more, Digital-to-Analog Converters (DACs) of 10 bits or more are required in Display Driver Integrated circuits (DDIs).

FIG. 1 is a block diagram showing a construction of a conventional flat panel display system. A pixel circuit 105 in a display panel is driven by a display driver Integrated Circuit (IC) 104. The display driver IC 104 is included of a column driver IC 102 and a row driver IC 103. In the display driver IC 104, the row driver IC 103 sequentially selects rows of the pixel circuit 105 and then the column driver IC 102 supplies a voltage or current corresponding to a gray scale to be expressed to each pixel. The output signals of the column driver IC 102 and the row driver IC 103 are controlled by a timing controller 101. A power source for driving the flat panel display system is supplied to a direct current (DC-DC) converter 100.

FIG. 2 is a block diagram illustrating a construction of the column driver IC 102 shown in FIG. 1. As shown in FIG. 2, the column driver IC 102, includes a shift register 200, a first latch unit 201, a second latch unit 202, a digital-to-analog converter 203, and an output unit 205. Furthermore, the column driver IC 102 can includes a reference voltage source 207 for generating and supplying a reference voltage to the digital-to-analog converter 203.

The reference voltage source 207 generates a positive gamma reference voltage and a negative gamma reference voltage, using a resistor string. The number ($2^N$) of the reference voltage inputted to the digital-to-analog converter 203 is determined depending on the number (N) of digital bits of RGB (Red, Green, and Blue) signals outputted from the first latch unit 201. The resistor string included in the reference voltage source 207 has one in every column driver IC. The digital-to-analog converter 203 has one in every channel. Thus, the digital-to-analog converter 203 is an important factor for determining an area of a driving apparatus for display because the digital-to-analog converter 203 provides hundreds per column driver IC 102.

FIGS. 3 to 5 are schematic circuit diagrams illustrating a construction of a conventional 10-bit digital-to-analog converter.

FIG. 3 shows a construction of a conventional 10-bit digital-to-analog converter with two stages.

Referring to FIG. 3, a first stage of the 10-bit digital-to-analog converter includes a first resistor column 300, an 8-bit decoder 301, and a first switch unit 302. The resistor column 300 generates and supplies a reference voltage to the first switch unit 302. The first switch unit 302 selects a reference voltage corresponding to a high 8-bit data signal outputted from the 8-bit decoder 301. A second stage includes a middle buffer 303, a second resistor column 304, a 2-bit decoder 305, a second switch unit 306, and an output buffer 307. The middle buffer 303 serves to separate the first stage and the second stage. The second resistor column 304 divides a reference voltage selected in the first switch unit 302 and supplies the divided reference voltage to the second switch unit 306. The second switch unit 306 selects a reference voltage corresponding to a low 2-bit data signal outputted from the 2-bit decoder 305.

The 10-bit digital-to-analog converter of FIG. 3 reduces a circuit area to some degree compared to a typical 10-bit digital-to-analog converter, but has a drawback of not being able to guarantee the accuracy and uniformity of output because of an offset error of the middle buffer 303.

FIG. 4 is a circuit diagram illustrating a 10-bit digital-to-analog converter proposed in the treatise made public by Society for Information Display (SID) 2005.

In the 10-bit digital-to-analog converter of FIG. 4, the middle buffer 303 shown in FIG. 3 has been omitted. In the digital-to-analog converter of FIG. 4, the middle buffer 303 has been omitted to reduce an offset error, but a loading effect in which a resistor of a second stage has influence upon an output of a first stage is caused. To reduce the loading effect, a resistance value of the second stage should increase. This leads to an increase of an area of a column driver IC.

FIG. 5 is a circuit diagram illustrating a 10-bit digital-to-analog converter made public in Korean Patent Application No. 10-2004-0093227 filed Nov. 15, 2004.

Referring to FIG. 5A, a first stage of the 10-bit digital-to-analog converter includes a resistor column 500, an 8-bit decoder 501, and a first switch unit 502. A second stage includes an output buffer 505, a 2-bit decoder 503, and a second switch unit 504.

FIG. 5B is a circuit diagram showing the output buffer 505 of FIG. 5A. Referring to FIG. 5B, four positive input transistors 506 are all equal in size. A negative input transistor 507 is four times the positive input transistor 506 in size. The positive input transistors 506 receive one reference voltage corresponding to a low 2-bit data signal among reference voltages outputted from the first stage. The 10-bit digital-to-analog converter shown in FIG. 5A reduces a circuit area to some degree compared to a typical 10-bit digital-to-analog converter, but causes a reduction of the accuracy and uniformity of a signal outputted from the output buffer 505 because an offset error and non-linearity of the output buffer 505 has a direct influence upon operation of the 10-bit digital-to-analog converter shown in FIG. 5A. Further, an electric power consumption increases because the number of the positive input transistors connecting in parallel on the output buffer 505 should increase in order for the second switch unit 504 of the second stage to process a data signal of 3 bits or more.

SUMMARY OF THE INVENTION

Accordingly, the present invention is to provide a driving apparatus for a display for minimizing an area of a digital-to-analog converter and improving the accuracy and uniformity of output.

In one aspect, there is provided a driving apparatus for a display. The apparatus comprises a reference voltage generator, a digital-to-analog converter, and an output unit. The reference voltage generator generates a plurality of reference voltages, and receives a difference value between two adjacent reference voltages and generates a plurality of sub reference voltages. The digital-to-analog converter selects one of the reference voltages corresponding to a high N-bit data signal (N: a positive integer less than "M") among M-bit data signals (M: a positive integer) and outputs the selected reference voltage as a first analog signal. The digital-to-analog converter selects one of the sub reference voltages corresponding to a low (M-N)-bit data signal among the M-bit data signals and outputs the selected sub reference voltage as a second analog signal. The output unit processes, by addition or subtraction, the first analog signal and the second analog signal for output.

The reference voltages generated in the reference voltage generator may comprise a positive gamma reference voltage and a negative gamma reference voltage.

The digital-to-analog converter may comprise a first selection switch unit and a second selection switch unit. The first selection switch unit selects one of the reference voltages corresponding to the high N-bit data signal and outputs the selected one reference voltage as the first analog signal. The second selection switch unit selects one of the sub reference voltages corresponding to the low (M-N)-bit data signal and outputs the selected sub reference voltage as the second analog signal.

The output unit may comprise a first switch for receiving the first analog signal at one terminal, an input capacitor connecting to the other terminal of the first switch at one terminal, a second switch connecting to the other terminal of the input capacitor at one terminal and receiving the second analog signal at the other terminal, and a third switch connecting to the one terminal of the second switch at one terminal.

The apparatus may further comprise a dummy switch provided between the other terminal of the first switch and one terminal of the input capacitor.

A first control signal may be applied to the first and third switches and a second control signal that is a reversed phase of the first control signal may be applied to the second switch.

The first control signal may be applied to the first and second switches and the second control signal may be applied to the third switch.

The output unit may further comprise an output buffer connecting to one terminal of the input capacitor at a non-inverse terminal and connecting with an output terminal at an inverse terminal.

The first, second, and third switches may be Metal Oxide Semiconductor (MOS) transistors.

It is to be understood that both the foregoing general description and the following detailed description are exemplary and explanatory and are intended to provide further explanation of the invention as claimed.

BRIEF DESCRIPTION OF THE DRAWINGS

The invention will be described in detail with reference to the following drawings in which like numerals refer to like elements.

DETAILED DESCRIPTION OF PREFERRED EMBODIMENTS

Preferred embodiments of she present invention will be described in a more detailed manner with reference to the drawings.

Figure 1:
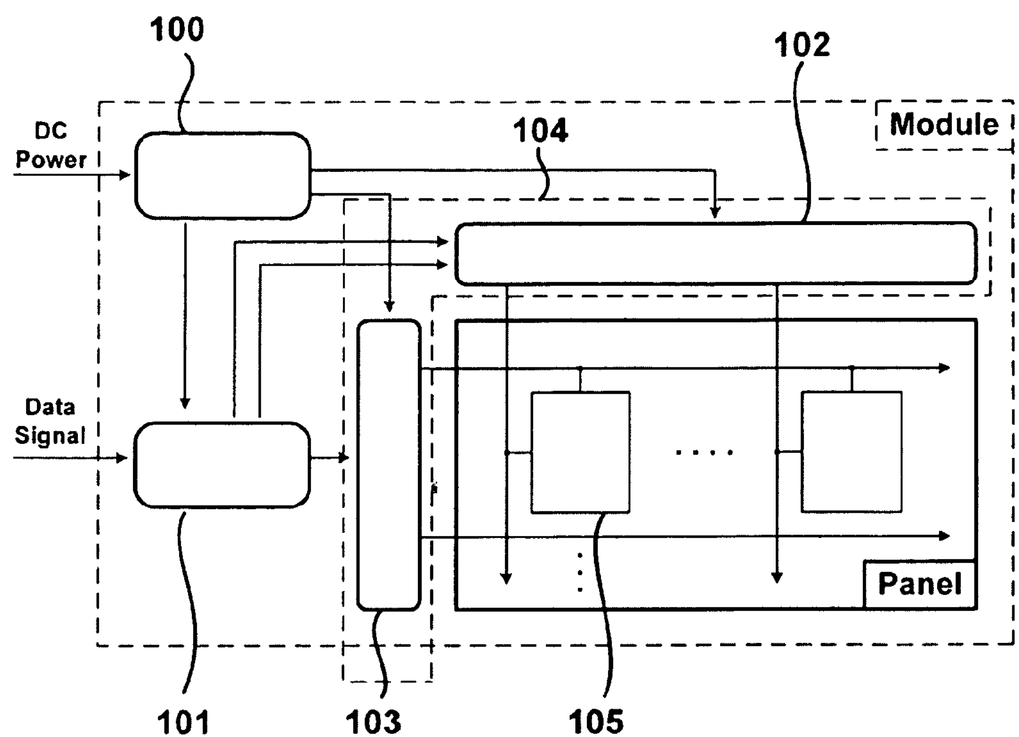
FIGS. 1 and 2 are block diagrams illustrating a construction of a general display system.
Figure 2:
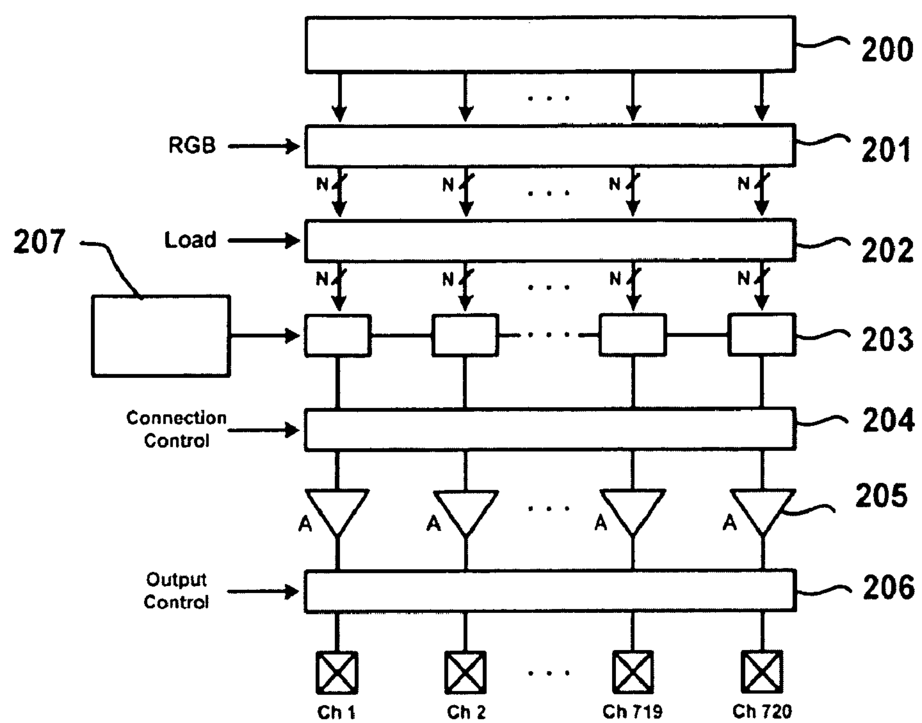
Figure 3:
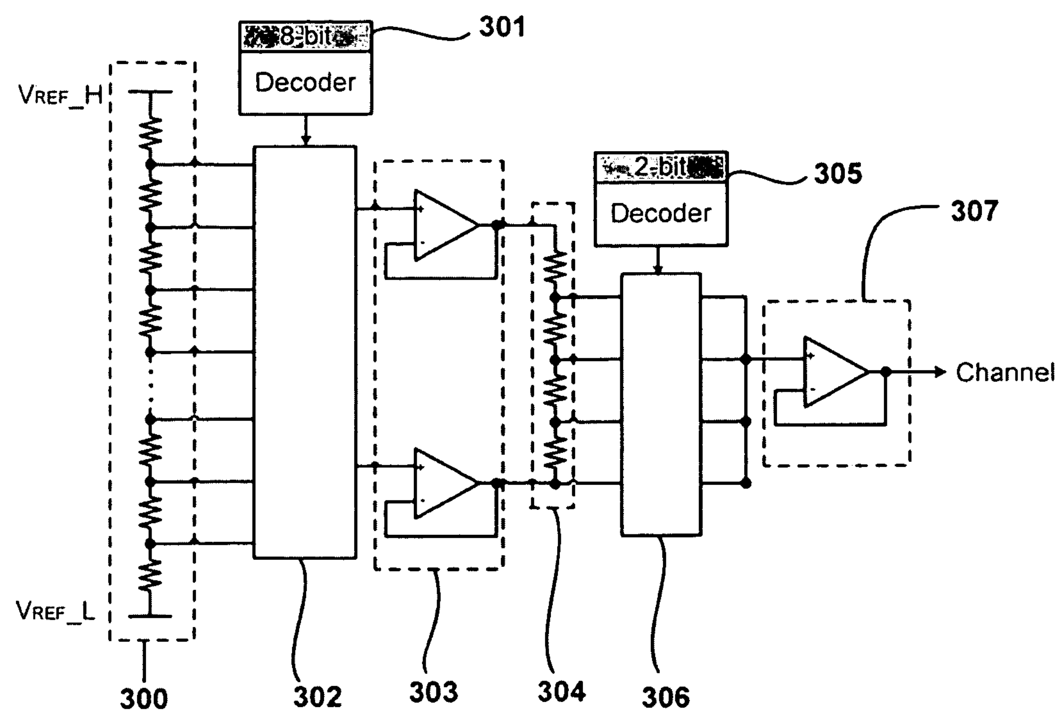
FIGS. 3 to 5 show a conventional 10-bit display driving apparatus.
Figure 4:
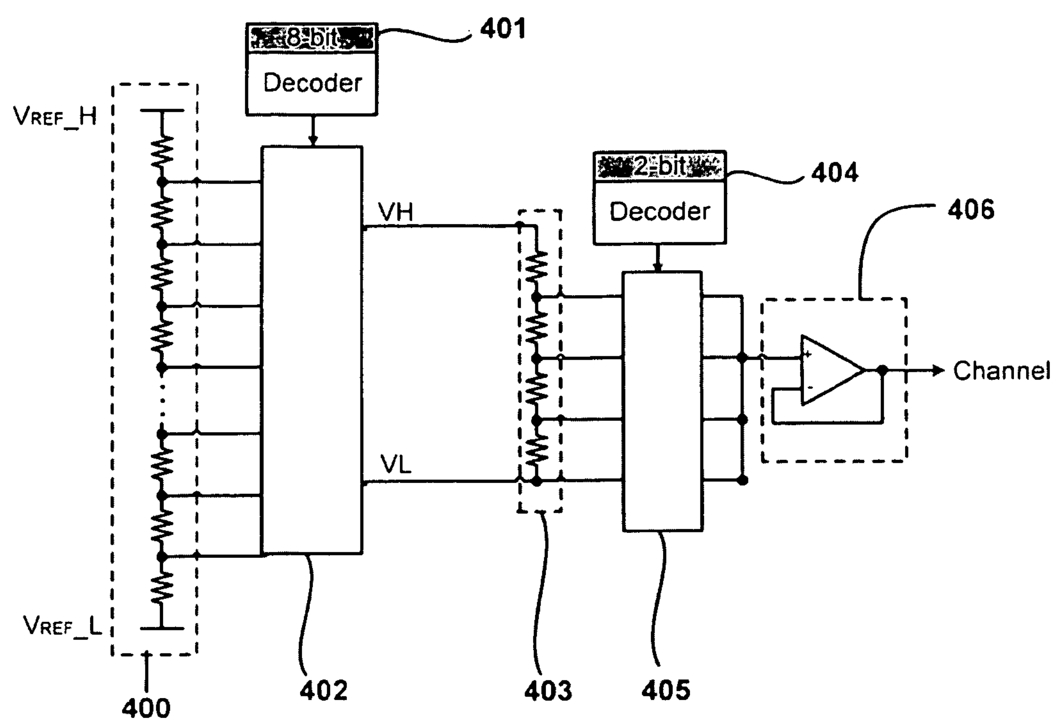
Figure 5:
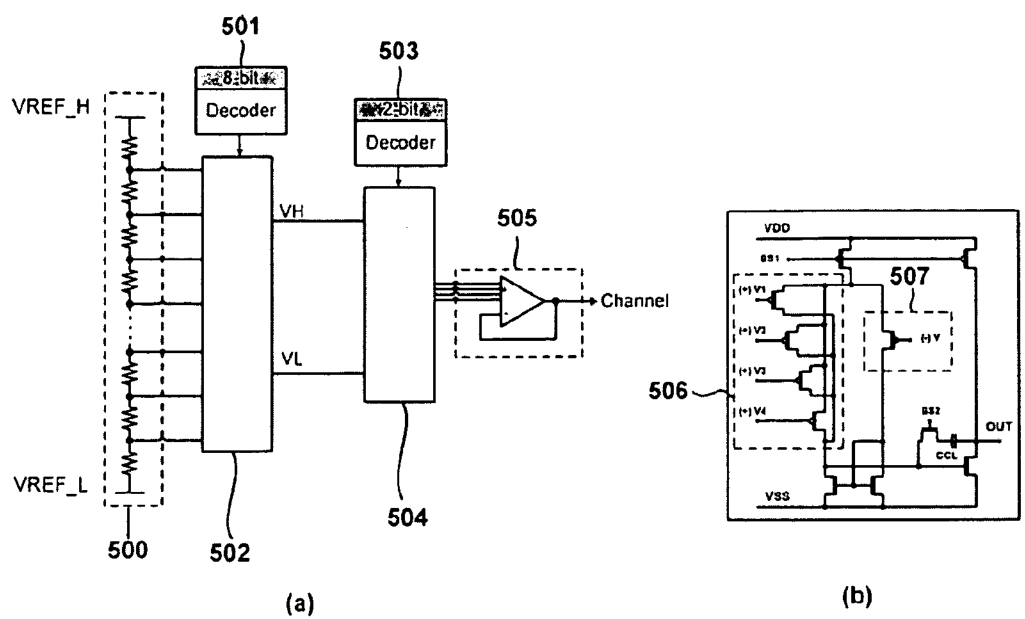
Figure 6:
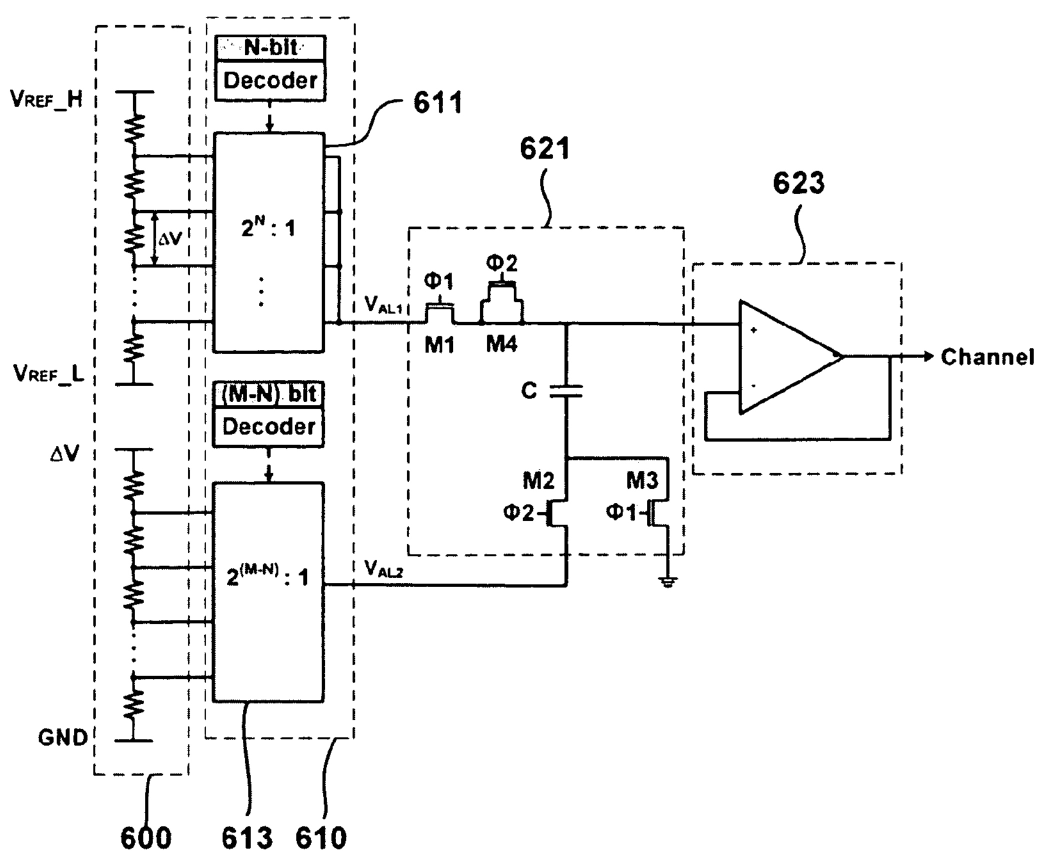
FIGS. 6 to 9 show a driving apparatus for a display according to an exemplary embodiment of the present invention.
Figure 7:
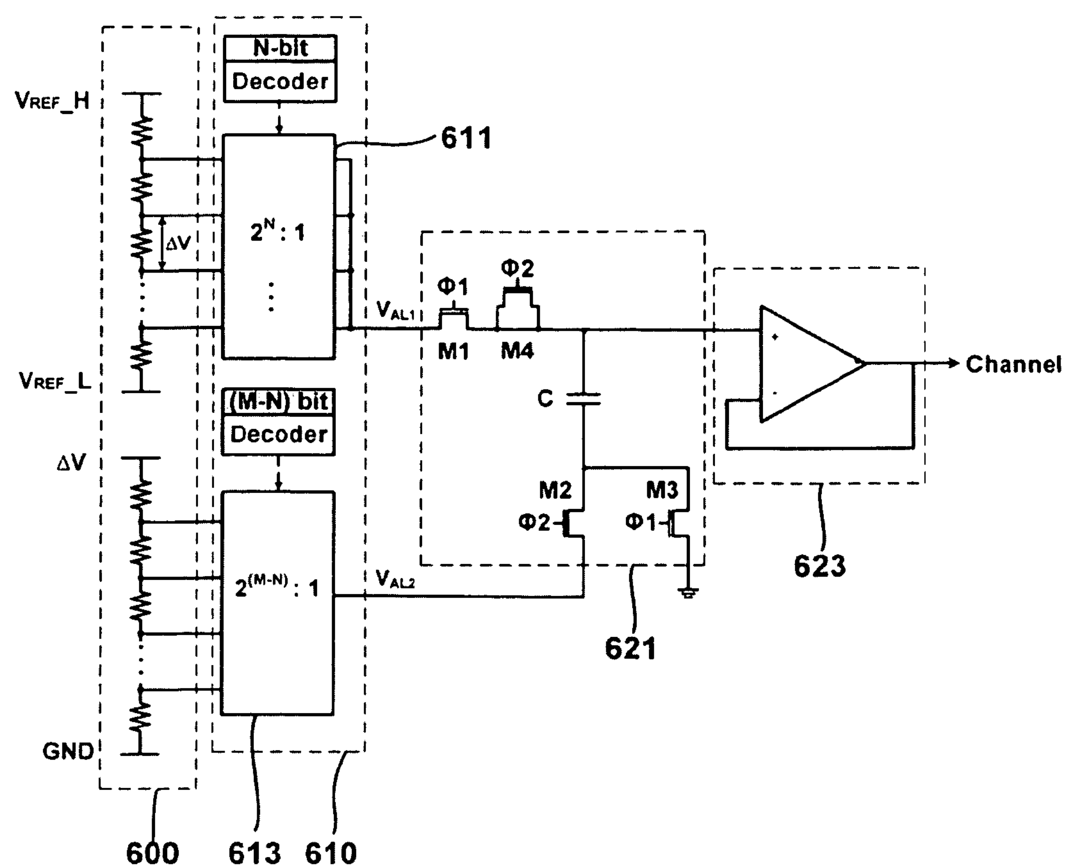
Figure 8:
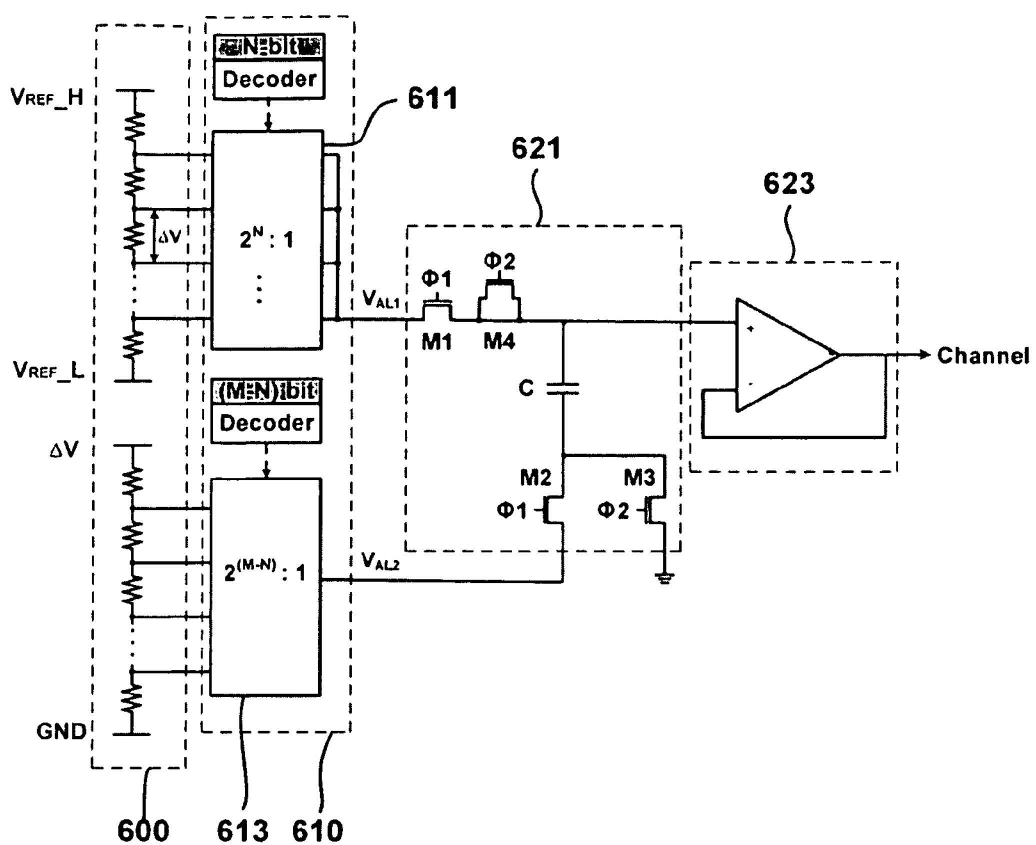

FIGS. 6 to 8 show a driving apparatus for a display according to an exemplary embodiment of the present invention.

Referring to FIG. 6, the driving apparatus for a display comprises a reference voltage generator 600, a digital-to-analog converter 610, and an output unit 620. The reference voltage generator 600 receives a source voltage necessary for driving and generates a plurality of reference voltages. The reference voltage generator 600 receives a difference value between two adjacent reference voltages among the generated reference voltages and generates a plurality of sub reference voltages. The digital-to-analog converter 610 selects one reference voltage corresponding to a high N-bit data signal (N: a positive integer less than "M") among the plurality of reference voltages and outputs the selected reference voltage as a first analog signal ($V_{AL1}$). The digital-to-analog converter 610 selects one sub reference voltage corresponding to a low (M-N)-bit data signal among the plurality of sub reference voltages and outputs the selected sub reference voltage as a second analog signal ($V_{AL2}$). The output unit 620 processes, by addition or subtraction, the first analog signal ($V_{AL1}$) and the second analog signal ($V_{AL2}$) for output.

Figure 9:
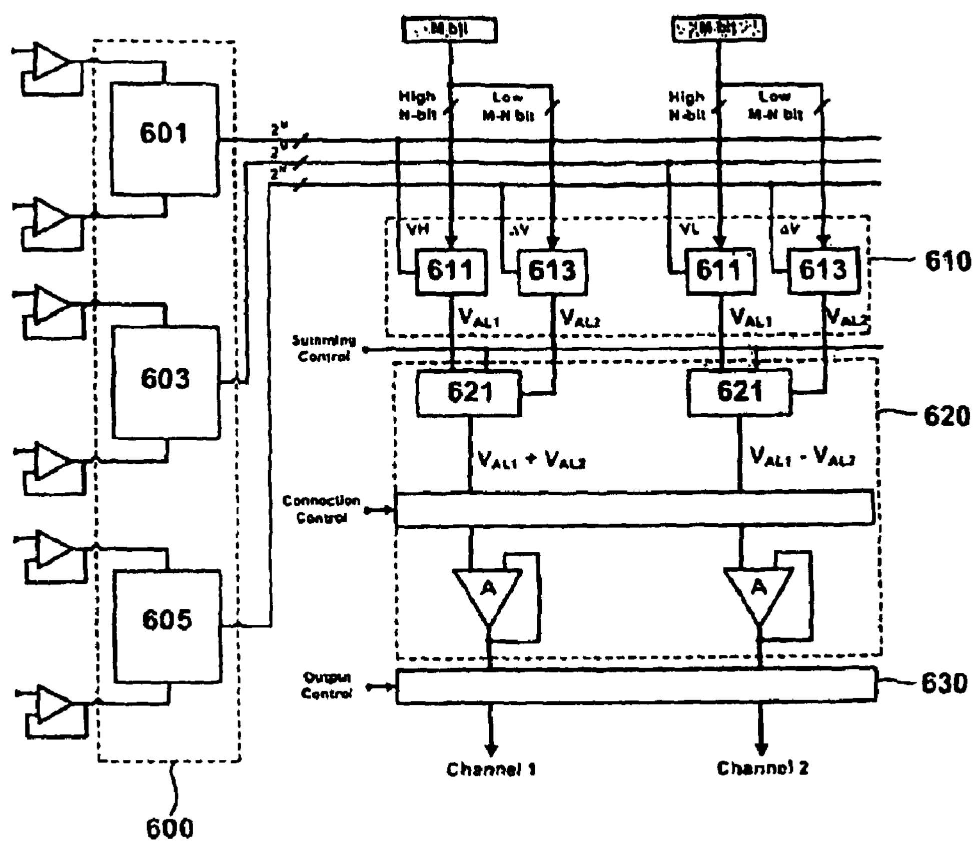

The reference voltage generator 600 generates a plurality of reference voltages using a resistor string dividing a received source voltage. Also, the reference voltage generator 600 receives a difference value between two adjacent reference voltages among the plurality of reference voltages and generates a sub reference voltage equally divided the received difference value by $2^{M-N}$. Differences between the reference voltages generated by the resistor string are all constant. Thus, the sub reference voltages have a linear characteristic with the reference voltage because the sub reference voltages are generated using a constant difference value between two adjacent reference voltages. The reference voltages generated in the reference voltage generator 600 comprises a positive gamma reference voltage and a negative gamma reference voltage. Thus, the reference voltage source 600, as shown in FIG. 9, can comprises a positive gamma reference voltage source 601 generating a positive gamma reference voltage and a negative gamma reference voltage source 603 generating a negative gamma reference voltage. The positive gamma reference voltages, the negative gamma reference voltages, and the sub reference voltages generated in the reference voltage generator 600 are supplied to the digital-to-analog converter 610, respectively.

The digital-to-analog converter 610 comprises a first selection switch unit 611 and a second selection switch unit 613. The first selection switch unit 611 selects one reference voltage corresponding to a high N-bit data signal among the reference voltages supplied from the reference voltage source 600 and outputs a first analog signal ($V_{AL1}$). That is the first analog signal ($V_{AL1}$) means the one reference voltage selected in the first selection switch unit 611. The second selection switch unit 613 selects one sub reference voltage corresponding to a low (M-N)-bit data signal among the sub reference voltages and outputs a second analog signal ($V_{AL2}$). That is, the second analog signal ($V_{AL2}$) means the one sub reference voltage selected in the second selection switch unit 613.

The reference voltages generated in the reference voltage generator 600 are applied to a plurality of switches comprised in the first selection switch unit 611, respectively. The sub reference voltages are applied to switches of the second selection switch unit 613, respectively. Together with this, the digital-to-analog converter 610 receives an M-bit data signal outputted from a latch stage. A high N-bit data signal among the M-bit data signals is inputted to the switches of the first selection switch unit 611, respectively. A low (M-N)-bit data signal among the M-bit data signals is inputted to the switches of the second selection switch unit 613, respectively. Thus, the first selection switch unit 611 selects one reference voltage corresponding to the high N-bit data signal among the plurality of reference voltages inputted and outputs the selected reference voltage as the first analog signal ($V_{AL1}$). The second selection switch unit 613 selects one sub reference voltage corresponding to the low (M-N)-bit data signal among the plurality of sub reference voltages inputted and outputs the selected sub reference voltage as the second analog signal ($V_{AL2}$). The first analog signal ($V_{AL1}$) and the second analog signal ($V_{AL2}$) from the digital-to-analog converter 610 are inputted to the output unit 620, respectively. The sub reference voltages are generated using a difference value between two adjacent reference voltages. Accordingly, the sub reference voltages are a level of tens of mV. Thus, a size of the switches installed within the second selection switch unit 613 and a (M-N)-bit decoder can be reduced because the second selection switch unit 613 and the (M-N)-bit decoder can be driven at a low voltage level. Accordingly, the driving apparatus for display has an effect of reducing an area occupied by the digital-to-analog converter 610. Also, the digital-to-analog converter 610 has an effect of improving the accuracy and uniformity of the first analog signal ($V_{AL1}$) and the second analog signal ($V_{AL2}$) because the digital-to-analog converter 610 uses reference voltages and sub reference voltages having a linear characteristic.

Referring to FIGS. 7 and 8, the output unit 620 comprises a first switch (M1), an input capacitor (C), a second switch (M2), and a third switch (M3). The first switch (M1) receives a first analog signal ($V_{AL1}$) at one terminal. The input capacitor (C) connects to the other terminal of the first switch (M1) at one terminal. The second switch (M2) connects to the other terminal of the input capacitor (C) at one terminal and receives a second analog signal ($V_{AL2}$) at the other terminal. The third switch (M3) connects to the one terminal of the second switch (M2) at one terminal. The first switch (M1), the second switch (M2), and the third switch (M3) are Metal Oxide Semiconductor (MOS) transistors. A output unit 620 can further comprise an output buffer 623 having a non-inversion terminal connecting to the one terminal of the input capacitor (C) and an inversion terminal connecting to an output terminal.

A method of driving depending on a plurality of control signal applied to the output unit 620 will be described with reference to FIGS. 7 and 8 below.

First, as shown in FIG. 7, a first control signal (ϕ1) is applied to the first switch (M1) and the third switch (M3) of the output unit 620. A second control signal (ϕ2) that is a reversed phase of the first control signal (ϕ1) is applied to the second switch (M2).

The first switch (M1) and the third switch (M3) turn on and the second switch (M2) turns off when the first control signal (ϕ1) is in high state and the second control signal (ϕ2) is in low state. This, the input capacitor (C) is charged at one terminal with the first analog signal ($V_{AL1}$). After that, the first switch (M1) and the third switch (M3) turn off and the second switch (M2) turns on when the first control signal (ϕ1) is in low state and the second control signal (ϕ2) is in high state. The output unit 620 can further comprise a dummy switch (M4) for preventing a movement of charges undesired to the one terminal of the input capacitor (C) when the first switch (M1) turns on/off. The input capacitor (C) is charged at the other terminal with a second analog signal ($V_{AL2}$) by a turn-on of the second switch (M2). Thus, the input capacitor (C) is charged at one terminal with a voltage more than the first analog signal ($V_{AL1}$) by the second analog signal ($V_{AL2}$). In other words, the input capacitor (C) is charged at one terminal with a sum of the first analog signal ($V_{AL1}$) and the second analog signal ($V_{AL2}$). The output unit 620 outputs a voltage that is the sum of the first analog signal ($V_{AL1}$) and the second analog signal ($V_{AL2}$) because the one terminal of the input capacitor (C) connects with the non-inversion terminal of the output buffer 623.

Second, as shown in FIG. 8, a first control signal (ϕ1) is applied to the first switch (M1) and the second switch (M2) of the output unit 620. A second control signal (ϕ2) is applied to the third switch (M3).

The first switch (M1) and the second switch (M2) turn on and the third switch (M3) turns off when the first control signal (ϕ1) is in high state and the second control signal (ϕ2) is in low state. Thus, the input capacitor (C) is charged at one terminal with the first analog signal ($V_{AL1}$), and is charged at the other terminal with the second analog signal ($V_{AL2}$). After that, the first switch (M1) and the second switch (M2) turn off and the third switch (M3) turns on when the first control signal (ϕ1) is in low state and the second control signal (ϕ2) is in high state. Here, the input capacitor (C) is discharged at the other terminal from the second analog signal ($V_{AL2}$) to 0V (ground) when the third switch (M3) is grounded at the other terminal. Thus, a voltage of the one terminal of the input capacitor (C) decreases from the first analog signal ($V_{AL1}$) by the second analog signal ($V_{AL2}$). The output unit 620 outputs a voltage that decreases from the first analog signal ($V_{AL1}$) by the second analog signal ($V_{AL2}$) because the one terminal of the input capacitor (C) connects with the non-inversion terminal of the output buffer 623. Thus, a block comprising the first switch (M1), the second switch (M2), the third switch (M3), and the input capacitor (C) in the output unit 620 shown in FIGS. 7 and 8 can be named as an adder-subtracter 621.

An output of the output unit 620 does not depend on a value and a rate of the capacitance because the adder-subtracter 621 uses a characteristic in which voltages charged/discharged at the both terminals of the input capacitor (C) vary equally. Thus, there is an effect that a circuit construction of the output unit 620 can be simplified and a whole area of the driving apparatus for display can be reduced because the number of capacitors used in the output unit 620 decreases.

FIG. 9 shows a whole construction of the driving apparatus for display according to an exemplary embodiment of the present invention.

As shown in FIG. 9, the driving apparatus for display comprises the digital-to-analog converter 610 and the output unit 620 as a unit. The digital-to-analog converter 610 selects one of positive gamma reference voltages corresponding to a high N-bit data signal among M-bit data signals, and selects one of sub reference voltages corresponding to a low (M-N)-bit data signal. The positive gamma reference voltages can be generated in the positive gamma reference voltage source 601 comprised in the reference voltage generator 600. The sub reference voltages can be generated in a sub reference voltage generator 605 comprised in the reference voltage generator 600. The output unit 620 adds a second analog signal ($V_{AL2}$) to a first analog signal ($V_{AL1}$) for output.

Alternately, the digital-to-analog converter 610 selects one of negative gamma reference voltages corresponding to the high N-bit data signal of the M-bit data signals, and selects one of sub reference voltages corresponding to the low (M-N)-bit data signal. The negative gamma reference voltages can be generated in the negative gamma reference voltage source 603 comprised in the reference voltage generator 600. The sub reference voltages can be generated in a sub reference voltage generator 605 comprised in the reference voltage generator 600. The output unit 620 subtracts the second analog signal ($V_{AL2}$) from the first analog signal ($V_{AL1}$) for output. Thus, the driving apparatus for display shown in FIG. 9 can output a desired output voltage depending on the positive gamma reference voltages and the negative gamma reference voltages by using the method of driving depending on the first control signal (ϕ1) and the second control signal (ϕ2).

As described above, the inventive display driving apparatus has an effect of improving the accuracy and uniformity of output by using a linear characteristic between reference voltages for processing a data signal, and decreasing the number of switches used in realizing the driving apparatus for display by simplifying a circuit construction of the output unit 620, thereby reducing a whole area.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A display driving apparatus comprising:

a reference voltage generator for generating a plurality of reference voltages, receiving a difference value between two adjacent reference voltages and using the difference value to generate a plurality of sub reference voltages;

a digital-to-analog converter for selecting one of the reference voltages corresponding to a high N-bit data signal among M-bit data signals and outputting the selected reference voltage as a first analog signal, and selecting one of the sub reference voltages corresponding to a low (M-N)-bit data signal among the M-bit data signals and outputting the selected sub reference voltage as a second analog signal, wherein M is a positive integer and N is a positive integer less than M; and an output unit for processing, by addition or subtraction, the first analog signal and the second analog signal for output.

2. The apparatus of claim 1, wherein the reference voltages generated in the reference voltage generator comprise a positive gamma reference voltage and a negative gamma reference voltage.

3. The apparatus of claim 1, wherein the digital-to-analog converter comprises:

a first selection switch unit for selecting one of the plurality of reference voltages corresponding to the high N-bit data signal and outputting the selected one reference voltage as the first analog signal; and a second selection switch unit for selecting one of the plurality of sub reference voltages corresponding to the low (M-N)-bit data signal and outputting the selected sub reference voltage as the second analog signal.

4. The apparatus of claim 1, wherein the difference value is constant and the sub reference voltages have a linear characteristic with the reference voltages.

5. The apparatus of claim 1, wherein the sub reference voltages have a level of tens of mV.

6. The apparatus of claim 1, wherein the output of the output unit does not depend on a value and a rate of a capacitor within the output unit.

7. The apparatus of claim 1, wherein the output unit processes the first analog signal and the second analog signal for output by addition under a first set of conditions and by subtraction under a second set of conditions.

8. The apparatus of claim 1, wherein the sub reference voltages equal the difference value divided by $2^{M-N}$.

9. A display driving apparatus comprising:

a reference voltage generator for generating a plurality of reference voltages, and receiving a difference value between two adjacent reference voltages and using the difference value to generate a plurality of sub reference voltages;

a digital-to-analog converter for selecting one of the reference voltages corresponding to a high N-bit data signal among M-bit data signals and outputting the selected reference voltage as a first analog signal, and selecting one of the sub reference voltages corresponding to a low (M-N)-bit data signal among the M-bit data signals and outputting the selected sub reference voltage as a second analog signal, wherein M is a positive integer and N is a positive integer less than M; and an output unit for processing, by addition or subtraction, the first analog signal and the second analog signal for output, the output unit comprising: a first switch for receiving the first analog signal at one terminal of the first switch; an input capacitor connecting to the other terminal of the first switch at one terminal of the input capacitor; a second switch connecting to the other terminal of the input capacitor at one terminal of the second switch and receiving the second analog signal at the other terminal of the second switch; and a third switch connecting to the one terminal of the second switch at one terminal of the third switch.

10. The apparatus of claim 9, further comprising:

a dummy switch provided between the other terminal of the first switch and the one terminal of the input capacitor.

11. The apparatus of claim 9, wherein a first control signal is applied to the first and third switches and a second control signal that is a reversed phase of the first control signal is applied to the second switch.

12. The apparatus of claim 11, wherein the first control signal is applied to the first and second switches and the second control signal is applied to the third switch.

13. The apparatus of claim 9, wherein the output unit further comprises: an output buffer connecting to the one terminal of the input capacitor at a non-inverse terminal of the output buffer and connecting with an output terminal at an inverse terminal of the output buffer.

14. The apparatus of claim 9, wherein the first, second, and third switches are Metal Oxide Semiconductor (MOS) transistors.

* * * * *